(12) United States Patent
Ruberg et al.

(10) Patent No.: US 7,949,863 B2
(45) Date of Patent: May 24, 2011

(54) INTER-PORT COMMUNICATION IN A MULTI-PORT MEMORY DEVICE

(75) Inventors: Alan T. Ruberg, Menlo Park, CA (US);
Dae Kyeung Kim, San Jose, CA (US);
Daeyun Shim, Cupertino, CA (US);
Dongyun Lee, San Jose, CA (US);
Myung Rai Cho, San Jose, CA (US);
Sungjoon Kim, Cupertino, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 1058 days.

(21) Appl. No.: 11/694,819

(22) Filed: Mar. 30, 2007

(65) Prior Publication Data

US 2007/0234021 A1 Oct. 4, 2007

Related U.S. Application Data

(60) Provisional application No. 60/788,401, filed on Mar. 30, 2006.

(51) Int. Cl.
*G06F 9/48* (2006.01)
*G06F 15/76* (2006.01)
(52) U.S. Cl. .......................................... 712/244; 712/40
(58) Field of Classification Search .................. 712/244, 712/40
See application file for complete search history.

(56) References Cited

U.S. PATENT DOCUMENTS

| | | | |
|---|---|---|---|
| 4,344,133 A * | 8/1982 | Bruce et al. .................. 710/269 | |
| 4,449,183 A | 5/1984 | Flahive et al. | |
| 4,729,091 A | 3/1988 | Freeman et al. | |
| 4,862,354 A | 8/1989 | Fiacconi et al. | |
| 5,142,683 A | 8/1992 | Burkhardt, Jr. et al. | |
| 5,144,314 A | 9/1992 | Malmberg et al. | |
| 5,175,853 A * | 12/1992 | Kardach et al. ............... 710/260 | |
| 5,423,008 A | 6/1995 | Young et al. | |

(Continued)

FOREIGN PATENT DOCUMENTS

EP 1209563 5/2002

OTHER PUBLICATIONS

"8029P008PCT ISR and WO Mailed Sep. 9, 2008 for Application PCT/US2007/065722", (Sep. 9, 2008), Whole Document.

(Continued)

*Primary Examiner* — Daniel Pan
(74) *Attorney, Agent, or Firm* — Blakely Sokoloff Taylor and Zafman

(57) ABSTRACT

A method and system for inter-port communication utilizing a multi-port memory device. The memory device contains an interrupt register, an interrupt signal interface (e.g., a dedicated pin), an interrupt mask, and one or more message buffers associated with each port. When a first component coupled to a first port of the memory device wants to communicate with a second component coupled to a second port of the memory device, the first component writes a message to a message buffer associated with the second port. An interrupt in the input register of the second port is set to notify the second component coupled to the second port that a new message is available. Upon receiving the interrupt, the second component reads the interrupt register to determine the nature of the interrupt. The second component then reads the message from the message buffer.

22 Claims, 4 Drawing Sheets

U.S. PATENT DOCUMENTS

| | | | | |
|---|---|---|---|---|
| 5,438,666 | A | * | 8/1995 | Craft et al. .................. 710/22 |
| 5,446,841 | A | * | 8/1995 | Kitano et al. ................ 709/213 |
| 5,561,784 | A | * | 10/1996 | Chen et al. ................... 711/157 |
| 5,764,882 | A | | 6/1998 | Shingo |
| 5,901,309 | A | * | 5/1999 | Hammer et al. ............. 712/244 |
| 6,002,633 | A | | 12/1999 | Oppold et al. |
| 6,118,792 | A | | 9/2000 | Beshail |
| 6,167,487 | A | | 12/2000 | Camacho et al. |
| 6,229,368 | B1 | | 5/2001 | Lee |
| 6,263,390 | B1 | | 7/2001 | Alasti et al. |
| 6,396,324 | B1 | | 5/2002 | Hsu et al. |
| 6,665,795 | B1 | | 12/2003 | Roth et al. |
| 6,795,360 | B2 | | 9/2004 | Duh et al. |
| 6,845,409 | B1 | * | 1/2005 | Talagala et al. .............. 710/20 |
| 7,369,453 | B2 | | 5/2008 | Kim |
| 7,405,995 | B2 | | 7/2008 | Ishimoto et al. |
| 7,433,263 | B2 | | 10/2008 | Kim |
| 2002/0065994 | A1 | * | 5/2002 | Henson et al. ............... 711/151 |
| 2003/0056061 | A1 | | 3/2003 | Sherman |
| 2003/0126424 | A1 | | 7/2003 | Horanzy et al. |
| 2006/0072563 | A1 | | 4/2006 | Regnier et al. |
| 2008/0074936 | A1 | | 3/2008 | Kim et al. |

OTHER PUBLICATIONS

"8029P066EP IPRP Mailed Jan. 29, 2009 for EP Patent Application 07759902.5-2210", (Jan. 29, 2009), Whole document.

EPO, "8029P052EP OA Mailed Mar. 26, 2009 for EP Application No. 07759905.8-1243", (Mar. 26, 2009), Whole Document.

Non-Final Office Action mailed Dec. 23, 2009 for U.S. Appl. No. 11/690,629, 29 pages.

International Preliminary Report on Patentability and Written Opinion mailed Oct. 9, 2008 for International Application No. PCT/US2007/065727, 15 pages.

USPTO, Non-final Office Action mailed Jan. 8, 2009 for U.S. Appl. No. 11/694,813, Jan. 8, 2009, Whole Document.

USPTO, Notice of Allowance mailed May 14, 2009 for U.S. Appl. No. 11/694,813, May 14, 2009, Whole document.

USPTO, Notice of Allowance mailed Aug. 21, 2009 for U.S. Appl. No. 11/694,813, Aug. 21, 2009, Whole document.

TW Associate report on Taiwanese Office Action for TW Application No. 096111507 mailed Mar. 22, 2010.

SIPO of the People's Republic of China, First Office Action for Chinese Patent Application No. 200780018383.3 mailed Mar. 10, 2010.

EPO, Communication pursuant to Article 94(3) European Application No. 07759902.5 mailed Jul. 8, 2010, 4 pp.

USPTO, Notice of Allowance for U.S. Appl. No. 11/690,629 mailed May 28, 2010.

EPO, Communication Pursuant to Article 94 (3) EPC for European Patent Application No. 07759901.7 mailed Jun. 30, 2009.

TW Associate report on Taiwanese Office Action for TW Application No. 096111507 mailed Aug. 25, 2010.

Office Action for Chinese Patent Application No. 200780018504.4 mailed Nov. 8, 2010.

Office Action for Taiwan Patent Application No. 096111504 mailed Dec. 7, 2010.

* cited by examiner

INTER-PORT COMMUNICATION IN A MULTI-PORT MEMORY DEVICE

CROSS-REFERENCE TO RELATED APPLICATIONS

The present application claims priority to U.S. Provisional Patent Application No. 60/788,401 entitled "INTEGRATED MULTI-PORT SERIAL MEMORY AND INTER-PROCESSOR COMMUNICATION," and filed on Mar. 30, 2006, which is hereby incorporated by reference.

BACKGROUND

In computer hardware, shared memory typically refers to a large block of random access memory that can be accessed by several different central processing units (CPUs) or other components in a multiple-processor computer system. For example, mobile phones often contain a baseband processor, media processor, and LCD controller, each of which may share a common memory area. The components of a multiple-processor system often need to share information. For example, the media processor of a mobile phone may run an operating system that interacts with the baseband processor to make a telephone call. As another example, the media processor may write information into a frame buffer of the LCD controller that describes an image to be displayed. The information sharing between components typically requires many different control and data interfaces. Control and data interfaces may be defined between each of the components and between the components and the shared memory. Moreover, there may be additional interfaces between each component using the shared memory for coordinating accesses of the shared memory.

The result of a multi-processor architecture is increased complexity within each component for handling the various interfaces and an increased number of interconnects necessary to support the needed communication between components. Interconnects are expensive and require extra work for each component to use. Often desirable components may not be used because they do not interoperate correctly with another required component. For example, a particular LCD controller may not be capable of communicating at a speed required by a particular media processor, such that a more expensive LCD controller must be selected. The interface requirements not only increase the complexity of the overall system, but also increase the cost. There is therefore a need for an improved method of communicating within a multi-processor system in a manner that minimizes the communication overhead that must be managed by the components in the system.

DETAILED DESCRIPTION

A method and system for inter-port communication utilizing a multi-port memory device is provided. The multi-port memory device includes multiple ports to which components of a multiprocessor system can connect. The communication of messages between the components connected to each of the ports is enabled by the use of a register file within the shared memory. For each port of the multi-port memory device, the memory device contains: an interrupt register, an interrupt signal interface (e.g., a dedicated pin), an interrupt mask, and one or more message buffers. When a first component coupled to a first port of the memory device wants to communicate with a second component coupled to a second port of the memory device, the first component writes a message to a message buffer associated with the second port. An interrupt in the input register of the second port is set to notify the second component coupled to the second port that a new message is available. Upon receiving the interrupt, the second component reads the interrupt register to determine the nature of the interrupt. The second component then reads the message from the message buffer. The second component may set an interrupt in the interrupt register associated with the first port to signal to the first component that the second component has completed processing of the message. Thus, the multi-port memory device enables components sharing the memory to communicate without external communication hardware or additional understanding of paradigms outside of reading and writing to the shared memory.

Various examples of the use of a multi-port memory device as a communications channel will now be described. The following description provides specific details for a thorough understanding and enabling description of these examples. One skilled in the art will understand, however, that the technology may be practiced without many of these details. Additionally, some well-known structures or functions may not be shown or described in detail, so as to avoid unnecessarily obscuring the relevant description of the various examples. The terminology used in the description presented below is intended to be interpreted in its broadest reasonable manner, even though it is being used in conjunction with a detailed description of certain specific examples of the technology. Certain terms may even be emphasized below; however, any terminology intended to be interpreted in any restricted manner will be overtly and specifically defined as such in this Detailed Description section.

I. System Architecture

Figure 1:
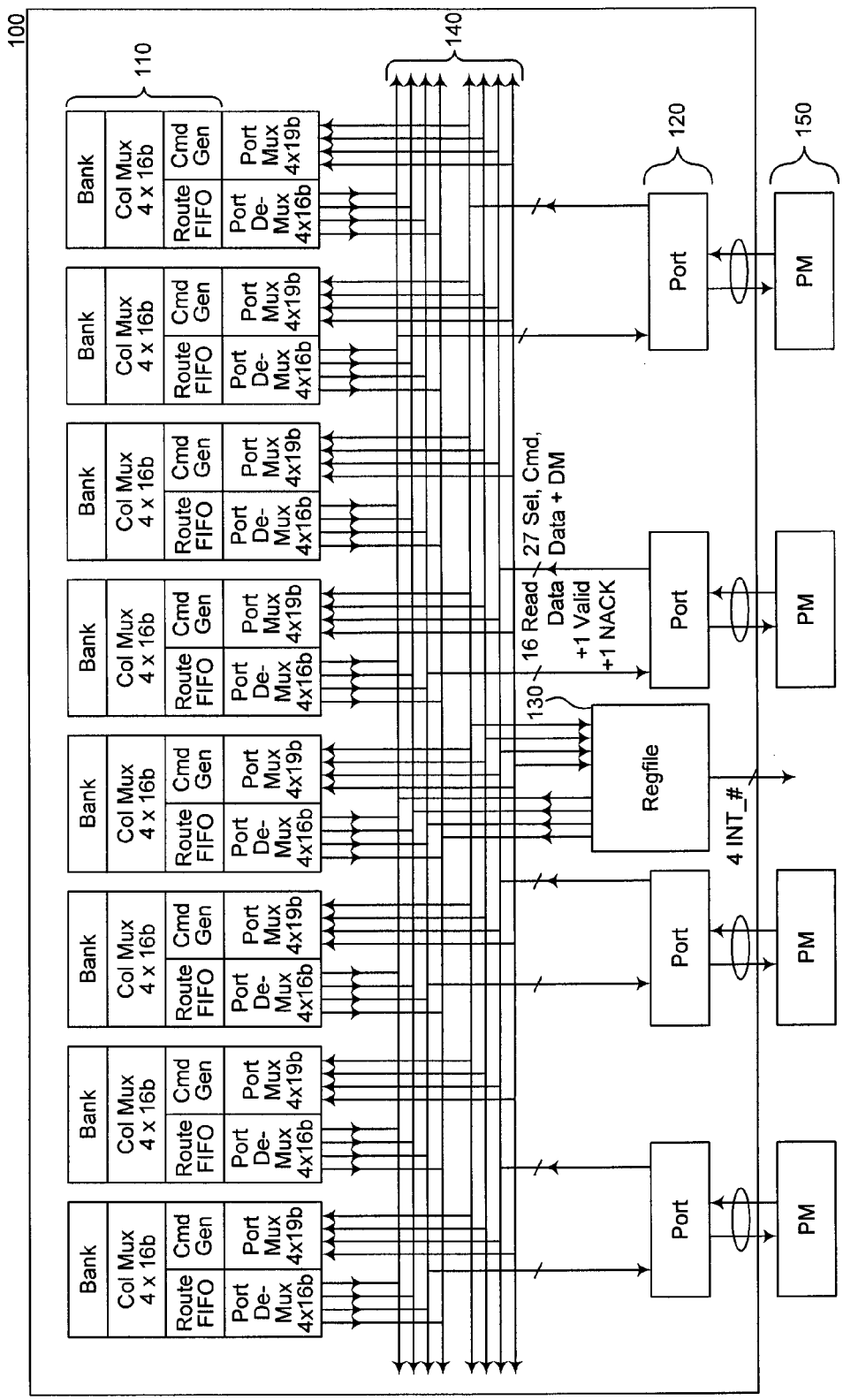
FIG. 1 is a block diagram that illustrates an architecture of a multi-port memory device used as a communications channel.

FIG. 1 is a block diagram that illustrates a multi-port memory device architecture as coupled to a number of components in a multi-processor environment. The multi-port memory device 100 comprises one or more banks of memory 110, two or more ports 120, and a register file 130. The memory, ports, and register file are all coupled by a bus 140 which enables any bank of memory or the register file to be accessed by any port. The one or more banks of memory 110 store data that may be accessed via the ports. The banks of memory 110 may be made up of dynamic random access memory (DRAM) or other common types of memory devices. Each of the two or more ports 120 may be connected to a corresponding port master (PM) 150. The port masters 150 can be any type of system component that uses shared memory, such as a baseband processor, media processor, or LCD controller. As will be described in additional detail herein, the multi-port memory device may be used as a communications channel to enable data communication between components in the multi-processor environment.

Figure 2:
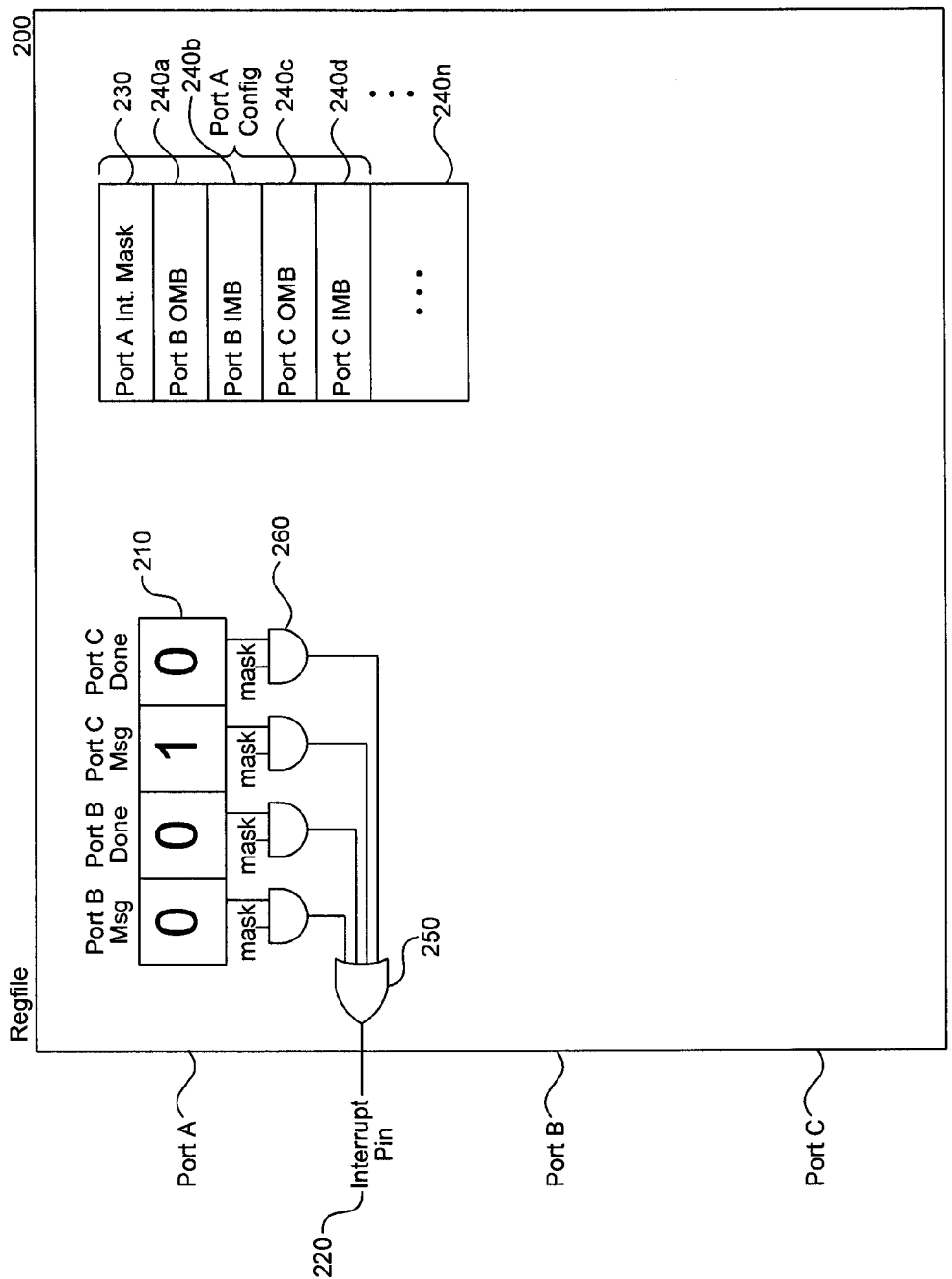
FIG. 2 is a block diagram that illustrates the configuration of a register file in the multi-port memory device.

FIG. 2 is a block diagram that illustrates the configuration of the register file 130 in some embodiments. The register file enables communication between components in the multi-processor environment by acting as a common signaling interface to indicate the presence or absence of a communication for a particular port. For each port of the multi-port memory, the register file 130 contains an interrupt register 210, an interrupt signal interface such as an interrupt pin 220, an interrupt mask buffer 230, and one or more message buffers 240a, 240b, . . . 240n. The interrupt register 210 contains a number of bits that signal various types of events that can occur for a particular port within the multi-port memory. Each of the bits of the interrupt register may be associated with a different event. The events are application-specific and may be defined differently by different users of the multi-port memory. An application may reserve a bit within each port's interrupt register for each of the other ports of the multi-port memory to signal that a new message is available for the port. An application may also reserve a bit within each port's interrupt register for each of the other ports to signal that processing of a message is complete. For example, the embodiment of the register file depicted in FIG. 2 is configured for three ports, Port A, Port B, and Port C. Each port has an associated interrupt register 210 with four bits (only the Port A interrupt register and Port A buffers are depicted in the figure). One bit of the interrupt register is used to represent a new message and one bit is used to represent a message reply for each of the two other ports. The interrupt register bits for Port A therefore represent a new message from Port B, a reply from Port B, a new message from Port C, and a reply from Port C. A value of "1" indicates that the interrupt has been set. In FIG. 2, for example, the bit indicating a new message from Port C has been set. If the message buffers are the mailboxes of the multi-port memory device, then the interrupt register is like the red flag on the side of mailbox that signals when new mail is available. By setting or clearing an appropriate bit in the register file, the communication status of that port may be conveyed to system components.

In some embodiments, the multi-port memory device stores the interrupt registers 210 in fast static random access memory (SRAM). The bits of the interrupt register may be standard flip-flops to save space and increase the speed of testing and setting the bits. Alternatively or additionally, the multi-port memory device may store the interrupt registers at a specified location of the shared memory itself. For example, the upper bytes of the shared memory may be reserved by an application for storing interrupt registers. The interrupt register may be a single register (e.g., 16 bits) that is allocated between ports, or multiple registers that are each associated with a different port.

In some embodiments, the multi-port memory reserves one or more bits of the interrupt register for debugging and testing purposes. For example, in a 3 port device having a 16 bit interrupt register, the multi-port memory may reserve bit 15 for a halt instruction that instructs a component attached to a particular port to discontinue further processing until the interrupt is cleared. Breakpoints can be implemented using a bit of the interrupt register to signal that a memory address to which the breakpoint applies is stored in a message buffer. For example, a debugging application may set a breakpoint at memory address 0x0100, and set the breakpoint bit in the interrupt register of each port.

The status of the interrupt register bits of a port are communicated to a system component via an interrupt pin 220 associated with that port. The presence of an interrupt signal on the interrupt pin 220 conveys to the attached component that a new interrupt has been set. The interrupt signal is generated by logically "ORing" the values of the interrupt register bits using logic gate 250 (in some embodiments a masking function is available which will be discussed below). The interrupt signal on the interrupt pin is generated whenever any bit of the interrupt register is set. Thus, the interrupt signal acts as a summary of the interrupt register and provides a single mechanism for notifying a component attached to the port that the component should inquire further as to the nature of the interrupt. Those skilled in the art will appreciate that an interrupt signal may be generated in ways other than the dedicated use of an interrupt pin disclosed herein.

In some embodiments, an interrupt mask may be used in the register file 130 to allow a component to read the status of a specific bit in the interrupt register 210. A number of logical AND gates 260 are provided to implement the mask feature. One input to each AND gate is a bit value of the interrupt register 210. The other input to each AND gate is a bit value of an interrupt mask that is stored in an interrupt mask register 230. By operation of the logical AND, only those interrupt register bits that have a corresponding bit set to "1" in the interrupt mask are applied to the logic gate 250. As a result, the interrupt signal on the interrupt pin 220 selectively represents the bit value of one or more bits in the interrupt register based on the interrupt mask value. A supervising port master (SPM) may set the interrupt masks on behalf of each port as part of a configuration phase performed during startup of the multi-port memory device. The interrupt mask may be stored in a predefined location within the shared memory, such that a component can update the interrupt mask by writing to the predefined location.

The interrupt mask can be used by applications to ignore certain interrupts. For example, in a mobile phone using the multi-port memory device, the baseband processor may not be interested in receiving interrupts from an LCD controller attached to the multi-port memory device. Therefore, the baseband processor can set the interrupt mask of the port to which it is attached to mask out the interrupts from the port to which the LCD controller is attached. Based on the interrupt mask, an interrupt signal will not be generated on the interrupt pin unless an interrupt that is not masked by the interrupt mask is set. In addition, the multi-port memory device may mask the bits returned in response to a TAS instruction such that ignored bits of the interrupt register are not included.

If an interrupt is detected by a component attached to the port, then the component issues a "test-and-set" (TAS) instruction to read the contents of the interrupt register 210. In some embodiments, the multi-port memory device provides for a TAS instruction to atomically test and set the value of the interrupt register. The TAS instruction reduces the number of accesses of the memory device required for the system component to process an interrupt by allowing simultaneous reading and clearing of interrupts, and the atomic nature of the instruction guards against race conditions. Those of ordinary skill in the art will recognize that common synchronization constructs, such as mutexes and semaphores, can be built using a TAS instruction. The component issues the TAS instruction by providing a test value against which to test the current value of the register and a set value to which to set the register if the current value and test values match. Typically, the test value tests if any bit is set, and the set value clears all bits. Thus, issuing a TAS instruction informs the component which interrupt bits were set in the interrupt register and clears any set bits at the same time. The component can then process the interrupts represented by the bits that were found to be set.

In some embodiments, the register file 130 includes message buffers 240a, 240b, . . . 240n that may be used to store additional details of an event that causes an interrupt. Each port may have an associated input message buffer (IMB) and an output message buffer (OMB). The IMB may be used by a first component coupled to a port to provide data to a second component coupled to another port, while the OMB may convey responsive data from the second component to the first component. For example, a component coupled to Port A may write information in the IMB of Port B describing an event that has taken place. The interrupt bit in the interrupt register of Port B may then be set to notify Port B that a new message is available. The component coupled to Port B can then retrieve the contents of the message buffer after processing the interrupt. In the example depicted in FIG. 2, because interrupt register bit 2 is set, indicating a new message from Port C, the component attached to Port A reads the Port C output message buffer 240c to determine the contents of the message from Port C. The component may reply by writing a message to the Port C input message buffer 240d, and setting the appropriate interrupt of Port C.

Although only three ports and four interrupt bits are shown in FIG. 2, the multi-port memory device can support any number of ports and interrupts. The purpose of each port and interrupt may be customized by each application for the use most appropriate for that application. Rather than being located in the register file 130, the message buffers 240a, 240b . . . 240n may be located within the shared memory, and the address of each message buffer may be configured during startup of the multi-port memory device.

In some embodiments, the multi-port memory device sets interrupts automatically when a new event is added to the register file. For example, if one component adds event information to a message buffer, the multi-port memory device may detect the new information and automatically set the correct interrupt within the receiving port's interrupt register. Automatically setting interrupts reduces the chances for error caused by a component attached to one port incorrectly setting the bits within the interrupt register of another port.

Figure 3:
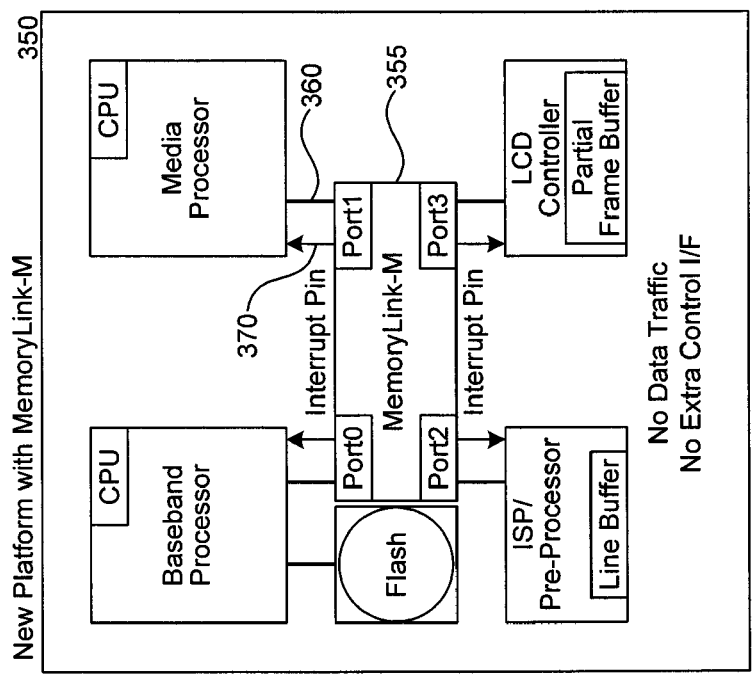
FIG. 3 is a block diagram that illustrates how the use of a multi-port memory device as a communications channel simplifies the interconnects between components.
Figure 3:
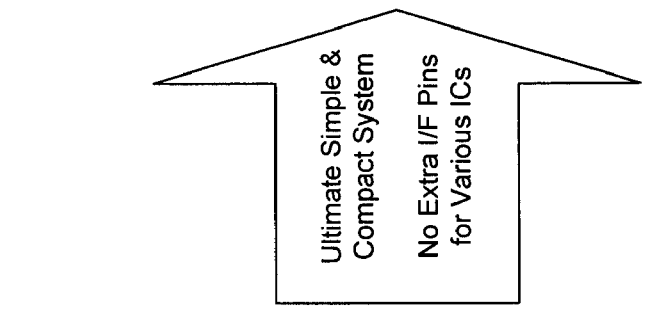
Figure 3:
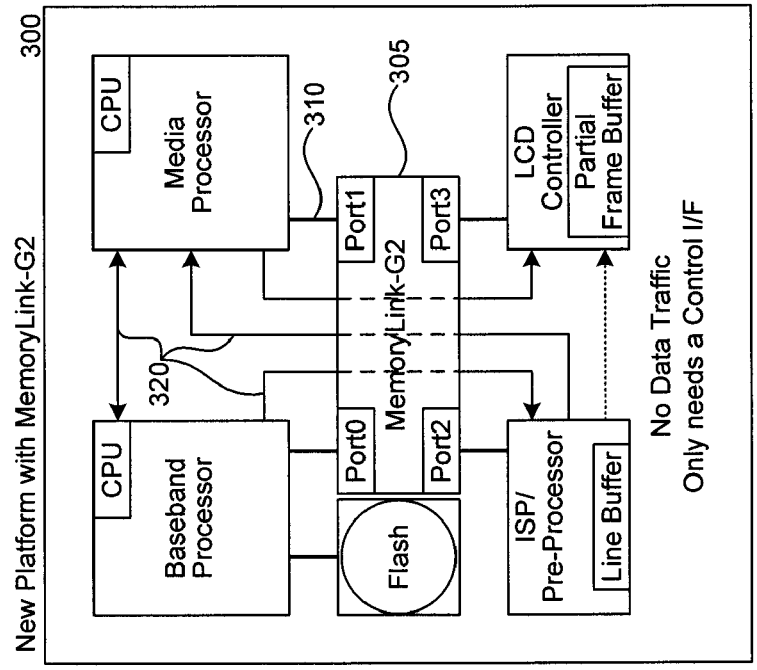

FIG. 3 is a block diagram that illustrates how the multi-port memory device architecture simplifies the interconnects between components in some embodiments. The system 300 contains multiple components, each component being connected to shared memory 305 through an interface 310. Each component also has numerous direct interconnects 320 with other components. The interconnects add complexity to the system, since they require the components to communicate with the other components using various interface protocols. The interconnects also add complexity to the system since they require additional routing paths and timing controls. The system 350 based on the multi-port memory device disclosed herein also contains multiple components connected to shared memory 355 through an interface 360. However, system 350 does not contain direct interconnects between the components. Rather, each component is connected to shared memory 355 via an interrupt pin 370. As was described herein, an interrupt signal on interrupt pin 370 informs a component when another component wants to communicate through the shared memory 355. The elimination of direct interconnects between components in the system greatly simplifies timing and interface issues.

Figure 4:
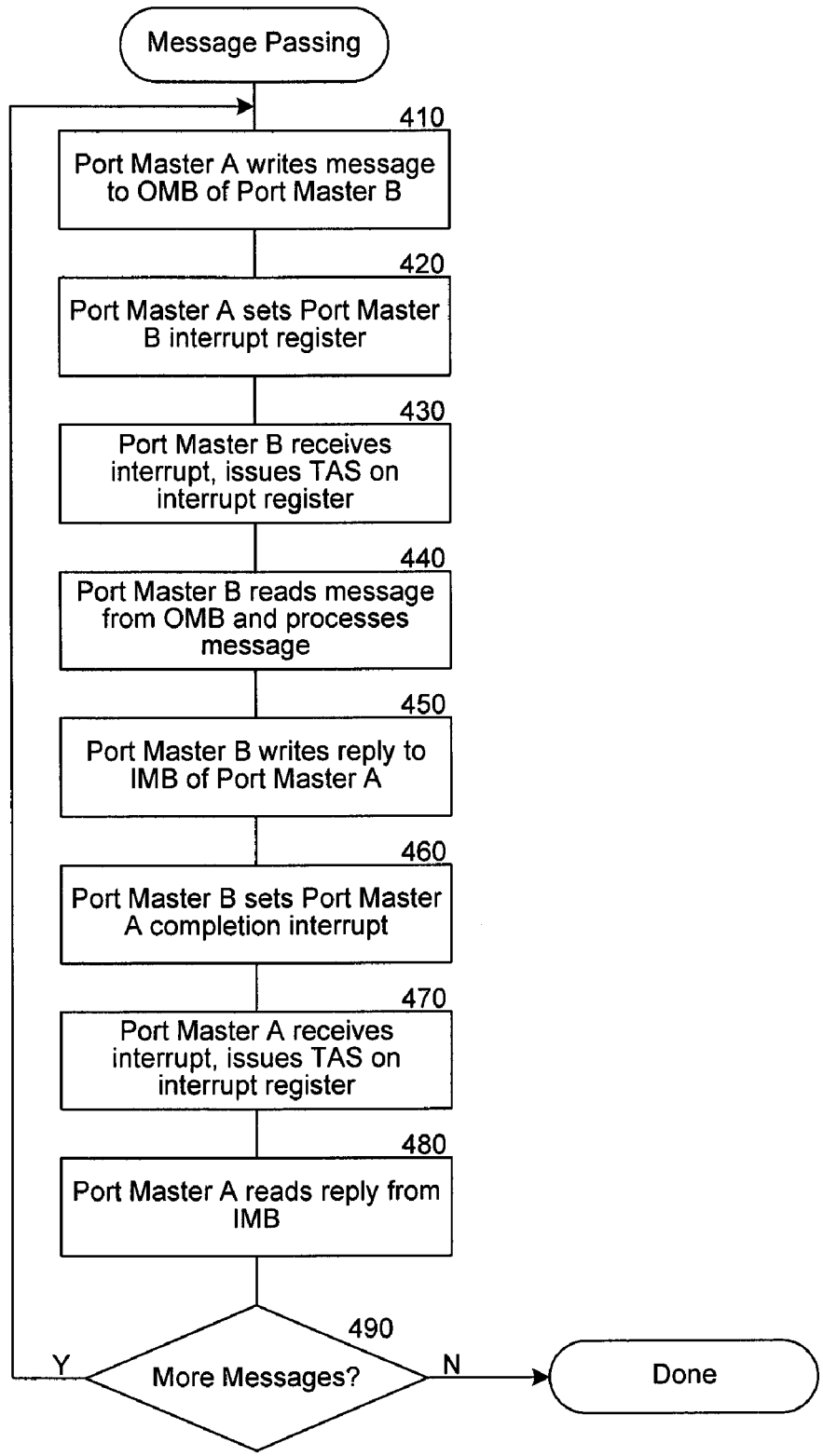
FIG. 4 is a flow diagram that illustrates the processing of the multi-port memory device when conveying communication messages between components.

FIG. 4 is a flow diagram that illustrates the processing of the multi-port memory device when communicating messages between components in some embodiments. In block 410, Port Master (PM) A writes a message into the OMB of a port utilized by PM B. In block 420, PM A sets the interrupt register of the port connected to PM B to notify PM B that a new message is available (alternatively, the interrupt may automatically be set when the new message is written to the OMB of PM B). Based on the contents of the interrupt register of PM B, the interrupt pin of the port used by PM B is also set. In block 430, PM B detects that the interrupt pin is set, and issues a TAS instruction to read the contents of the interrupt register and clear the interrupt. In block 440, PM B reads the message written to the OMB by PM A and processes the message. In block 450, PM B writes a reply message into the IMB of the port utilized by PM A. In block 460, PM B sets the interrupt register of the port used by PM A to notify PM A that the message has been processed and a reply is available. Based on the contents of the interrupt register of PM A, the interrupt pin of the port is also set. In block 470, PM A detects that the interrupt pin is set, and issues a TAS instruction to read the contents of the interrupt register and clear the interrupt. In block 480, PM A reads the reply message written to the IMB by PM B and processes the reply. In decision block 490, if there are more messages then PM A loops to block 410 and sends another message, else the process completes.

II. Register File Usage

Following are several examples of how the register file can be used by different applications to coordinate and share information between components.

Storage applications often comprise one or more port masters that share a memory device. The port masters (PMs) may represent processors, other storage devices (e.g., hard drives), and other hardware components attached to the memory device. One port master is often designated the supervising port master (SPM). The SPM typically directs the behavior of the other port masters. For example, during power-up the SPM may gather configuration information from an attached flash memory and configure each of the ports of the memory device for the other PMs. The SPM may provide each port of the multi-port memory device with a port speed and other configuration information, such as the location of message buffers for the port, the location of interrupt masks, the meaning of each interrupt bit within the interrupt register, and so forth. The SPM may also enable and disable each port based on the needs of the application. For example, the SPM may instruct a port to remain disabled by setting a bit in the interrupt register of the port until other components of the system have completed power-up and are ready for operation. The SPM may also instruct some ports to disable themselves based on current power requirements of the system, or based on inactivity of a particular device (e.g., dimming the screen of an LCD display of a mobile phone).

Another example of using the register file is the sharing of banks of memory by several components attached to a memory device. In the simplest case, each component is assigned its own bank of memory and no sharing is necessary. However, applications often require that banks be shared so that more available memory can be directed to a particular use based on the current load of the system. For example, in a mobile phone, the baseband processor may require more memory when making a call, while the media processor may require more memory when playing a game. The components of the system may also need to share information, and may do so by sharing banks of memory. One component may write to the memory, and another component may read from the memory to share information between the components.

In cases where the access to banks of memory is shared, coordination of access to the banks is important to ensure that data is not corrupted. The register file can be used by applications to coordinate accesses to a bank of memory. For example, an interrupt may be defined for reserving a bank of memory for use. When a component wants to use a bank of memory, the component issues a TAS instruction to attempt to reserve the bank of memory for use. If the bank is not currently in use, then the TAS instruction indicates that the bank is available, and the component has simultaneously reserved the bank for use as part of the TAS instruction. The component can read and write through the port to the memory once the bank is reserved. When the component is through using the bank, it can clear the reservation of the bank by issuing another TAS instruction. When another component wants to use the memory, the process repeats. A component may find that the memory is already in use, in which case the TAS instruction will indicate that the bank was already reserved and the component may wait until the bank is no longer reserved by polling the interrupt register using the TAS instruction.

In some embodiments, the multi-port memory may provide another interrupt bit for the next in line to reserve the bank, such that even though a component is currently using the bank, the next component that wants to use the bank can register its interest. Thus, a second port can be notified by a first port when a component connected to the first port is through using the bank so that the second port does not have to poll while waiting for the bank to be available.

III. Conclusion

Unless described otherwise below, aspects of the invention may be practiced with conventional systems. Thus, the construction and operation of the various blocks shown in the figures may be of conventional design, and need not be described in further detail herein to make and use the invention, because such blocks will be understood by those skilled in the relevant art. Aspects of the system may be implemented using computer-executable instructions, such as program modules, executed by one or more computers or other devices. Generally, program modules include routines, programs, objects, components, data structures, and so on that perform particular tasks or implement particular abstract data types. Typically, the functionality of the program modules may be combined or distributed as desired in various embodiments.

From the foregoing, it will be appreciated that specific embodiments of the multi-port memory have been described herein for purposes of illustration, but that various modifications may be made without deviating from the spirit and scope of the invention. Accordingly, the invention is not limited except as by the appended claims.

We claim:

1. A method of sharing memory between a first component coupled to a first port of a multi-port memory device and a second component coupled to a second port of the device, the method comprising:
    receiving a message from a first component at a first port of a multi-port memory device, the message being directed to the second component;
    writing data for the message into an output message buffer of a memory buffer associated with the second port, the memory buffer including an output message buffer and an input memory buffer related to each of the other ports of the multi-port memory device, the output message buffer being for receiving message data from another port and the input message buffer being for receiving reply data from another port;
    automatically setting an interrupt register associated with the second port in response to the writing of the message data, setting the interrupt register including setting one or more bits of the interrupt register to indicate that the message from the first port was received at the second port;
    automatically setting an interrupt signal associated with the second port of the multi-port memory device in response to the setting of the interrupt register to notify the second port of the occurrence of an event, the interrupt signal being set based on one or more settings of the interrupt register associated with the second port;
    after detection of the interrupt signal by a second component coupled to the second port, sending the contents of the interrupt register associated with the second port to the second component in response to a request from the second component; and
    providing the data for the message from the output message buffer associated with the second port to the second component in response to a request.

2. The method of claim 1 wherein setting the interrupt signal associated with the second port comprises setting an interrupt pin coupled with the second component to notify the second component of the receipt of a message or reply.

3. The method of claim 1 wherein setting the interrupt signal associated with the second port includes determining whether the contents of the interrupt register associated with the second port matches an interrupt mask, and setting the interrupt signal if the contents matches the interrupt mask.

4. The method of claim 1 further comprising:
    receiving reply data from the second component at the second port;
    writing the received reply data to an input message buffer associated with the first port of the multi-port memory device;
    automatically setting an interrupt register associated with the first port in response to the writing of the reply data, setting the interrupt register including setting one or more bits of the interrupt register to indicate that the reply from the second port was received at the first port;
    setting an interrupt signal associated with the first port of the multi-port memory device to notify the first port of the occurrence of an event, the interrupt being set based on one or more settings of the interrupt register associated with the first port;
    providing the contents of the interrupt register associated with the first port to the second component in response to a request from the first component to read the contents of the interrupt register associated with the first port; and
    providing the data for the reply from the input message buffer associated with the first port to the first component in response to a request.

5. The method of claim 1 wherein the interrupt signal is set by a set of bits in the interrupt register.

6. The method of claim 5 wherein the set of bits contains at least one bit for each other port of the multi-port memory device.

7. The method of claim 5 wherein the interrupt register for a particular port contains a bit for receiving reply messages for each other port of the multi-port memory device.

8. The method of claim 5 wherein the interrupt register contains at least one bit reserved for debugging purposes.

9. The method of claim 1 wherein providing the contents of the interrupt register in response to the request from the second component comprises responding to a test-and-set instruction.

10. The method of claim 1 wherein the interrupt register is stored in a memory location within the multi-port memory device.

11. The method of claim 1 wherein the ports are serial ports.

12. The method of claim 1 wherein a data path used for sending the contents of the interrupt register is the same as the data path used for transferring data to and from the memory within the multi-port memory device.

13. A system for sharing information between components attached to a multi-port memory system, the system comprising:

one or more shared memory banks for storing information accessible by a plurality of ports of the multi-port memory system;

an interrupt register for each of the plurality of ports, the interrupt register for a first port containing bits relating to each of the other ports of the plurality of ports to inform a component coupled to the first port regarding the source of a message or reply, the bits to be set automatically when a message or reply from any of the other ports is stored;

an interrupt pin for each port of the plurality of ports, an interrupt signal for the first port being activated on the interrupt pin based upon states of the bits of the interrupt register indicating receipt of messages from any of the other ports or receipt of replies from any of the other ports;

a plurality of memory buffers, a memory buffer of the plurality of memory buffers being associated with each port of the plurality of ports, the memory buffer associated with the first port including an output message buffer and an input memory buffer related to each of the other ports, the output message buffer being for receiving message data from another port and the input message buffer for receiving reply data from another port; and an interrupt handling component for implementing an interrupt handling procedure based on the contents of the interrupt register.

14. The system of claim 13, wherein the interrupt register is comprised of a plurality of bits and wherein the settings of the bits indicate the type of event.

15. The system of claim 14 including an interrupt mask associated with each port of the plurality of ports, the interrupt mask associated with the first port being compared to the interrupt register associated with the first port in order to identify a particular type of event for setting of the interrupt pin for the first port.

16. The system of claim 13 further comprising a random access memory separate from the shared memory banks, wherein the interrupt register associated with each port is stored in the random access memory.

17. The system of claim 16, wherein the random access memory is faster memory than the shared memory banks.

18. A computer-readable medium containing instructions for sharing memory between a first component coupled to a first port of a multi-port memory device and a second component coupled to a second port of the device, by a method comprising:

receiving a message from a first component at a first port of a multi-port memory device, the message being directed to the second component;

writing data for the message into an output message buffer of a memory buffer associated with the second port, the memory buffer including an output message buffer and an input memory buffer related to each of the other ports of the multi-port memory device, the output message buffer being for receiving message data from another port and the input message buffer being for receiving reply data from another port;

automatically setting an interrupt register associated with the second port in response to the writing of the message data, setting the interrupt register including setting one or more bits of the interrupt register to indicate that the message from the first port was received at the second port;

automatically setting an interrupt signal associated with the second port of the multi-port memory device in response to the setting of the interrupt register to notify the second port of the occurrence of an event, the interrupt signal being set based on one or more settings of the interrupt register associated with the second port;

after detection of the interrupt signal by a second component coupled to the second port, sending the contents of the interrupt register associated with the second port to the second component in response to a request from the second component; and providing the data for the message from the output message buffer associated with the second port to the second component in response to a request.

19. The medium of claim 18 wherein setting the interrupt signal associated with the second port comprises setting an interrupt pin coupled with the second component to notify the second component of the receipt of a message or reply.

20. The medium of claim 18 wherein setting the interrupt signal associated with the second port includes determining whether the contents of the interrupt register associated with the second port matches an interrupt mask, and setting the interrupt signal if the contents matches the interrupt mask.

21. The medium of claim 18 further comprising instructions for:

receiving reply data from the second component at the second port;

writing the received reply data to an input message buffer associated with the first port of the multi-port memory device;

automatically setting an interrupt register associated with the first port in response to the writing of the reply data, setting the interrupt register including setting one or more bits of the interrupt register to indicate that the reply from the second port was received at the first port;

setting an interrupt signal associated with the first port of the multi-port memory device to notify the first port of the occurrence of an event, the interrupt being set based on one or more settings of the interrupt register associated with the first port;

providing the contents of the interrupt register associated with the first port to the second component in response to a request from the first component to read the contents of the interrupt register associated with the first port; and providing the data for the reply from the input message buffer associated with the first port to the first component in response to a request.

22. The medium of claim 19 wherein providing the contents of the interrupt register in response to the request from the second component comprises responding to a test-and-set instruction.

* * * * *